United States Patent
Yuan et al.

(10) Patent No.: US 9,917,157 B2
(45) Date of Patent: Mar. 13, 2018

(54) THIN FILM TRANSISTOR, ARRAY SUBSTRATE, THEIR MANUFACTURING METHODS, AND DISPLAY DEVICE

(71) Applicants: BOE TECHNOLOGY GROUP CO., LTD., Beijing (CN); SOUTH CHINA UNIVERSITY OF TECHNOLOGY, Guangdong (CN)

(72) Inventors: Guangcai Yuan, Beijing (CN); Liangchen Yan, Beijing (CN); Xiaoguang Xu, Beijing (CN); Lei Wang, Beijing (CN); Junbiao Peng, Beijing (CN); Linfeng Lan, Beijing (CN)

(73) Assignees: BOE TECHNOLOGY GROUP CO., LTD. (CN); SOUTH CHINA UNIVERSITY OF TECHNOLOGY (CN)

( * ) Notice: Subject to any disclaimer, the term of this patent is extended or adjusted under 35 U.S.C. 154(b) by 0 days.

(21) Appl. No.: 15/303,231

(22) PCT Filed: Oct. 9, 2015

(86) PCT No.: PCT/CN2015/091545
§ 371 (c)(1),
(2) Date: Oct. 11, 2016

(87) PCT Pub. No.: WO2016/179952
PCT Pub. Date: Nov. 17, 2016

(65) Prior Publication Data
US 2017/0141193 A1 May 18, 2017

(30) Foreign Application Priority Data
May 11, 2015 (CN) .......................... 2015 1 0236824

(51) Int. Cl.
*H01L 27/12* (2006.01)
*H01L 29/24* (2006.01)
(Continued)

(52) U.S. Cl.
CPC ........ *H01L 29/24* (2013.01); *H01L 21/02565* (2013.01); *H01L 21/02631* (2013.01);
(Continued)

(58) Field of Classification Search
CPC .................................................. H01L 27/1225
See application file for complete search history.

(56) References Cited

U.S. PATENT DOCUMENTS

2013/0234134 A1* 9/2013 Inoue .................. H01L 29/7869
257/43
2015/0084013 A1 3/2015 Ohmi

FOREIGN PATENT DOCUMENTS

| CN | 102187467 A | 9/2011 |
| CN | 102351528 A | 2/2012 |

(Continued)

OTHER PUBLICATIONS

First Office Action for Chinese Application No. 201510236824.3, dated Jun. 2, 2017, 6 Pages.
(Continued)

*Primary Examiner* — Benjamin Sandvik
(74) *Attorney, Agent, or Firm* — Brooks Kushman P.C.

(57) ABSTRACT

The present disclosure provides a TFT, an array substrate, their manufacturing method, and a display device. The method for manufacturing the TFT includes a step of forming a pattern of a semiconductor active layer on a transparent substrate through a patterning process, and the pattern of the semiconductor active layer includes a lanthanum boride pattern.

16 Claims, 4 Drawing Sheets

(51) Int. Cl.
  *H01L 29/66* (2006.01)
  *H01L 21/02* (2006.01)
  *H01L 29/786* (2006.01)

(52) U.S. Cl.
  CPC ........ *H01L 27/127* (2013.01); *H01L 27/1225* (2013.01); *H01L 27/1288* (2013.01); *H01L 29/66969* (2013.01); *H01L 29/7869* (2013.01); *H01L 29/78696* (2013.01)

(56) References Cited

FOREIGN PATENT DOCUMENTS

| CN | 203406293 U | 1/2014 |
| CN | 103855194 A | 6/2014 |
| CN | 104934482 A | 9/2015 |
| JP | H0475372 A | 3/1992 |
| KR | 20150019137 A | 2/2015 |

OTHER PUBLICATIONS

International Search Report and Written Opinion for Application No. PCT/CN2015/091545, dated Oct. 9, 2015, 12 Pages.

Second Office Action for Chinese Application No. 201510236824.3, dated Nov. 28, 2017, 7 Pages.

Xu, Jing, "Dissertation: Preparation Technology and Properties of Magnetron Sputtering SiO2 Based LaB6 films," School of Material Science and Technology, Shandong University, Apr. 2009, Parts 1-2, 138 pages.

Xu et al., "The Influence of Sputtering Bias-Voltage on LaB6 Film's Characteristics," International Journal of Modern Physics B, vol. 23, Nos. 6 & 7, 2009, 6 pages.

Xu et al., "Dependence of Characteristics of LaB6 Films on DC Magnetron Sputtering Power," Transactions of Nonferrous Metals Society of China, vol. 19, Elsevier Science Press, China, Jun. 18, 2008, 4 pages.

* cited by examiner

THIN FILM TRANSISTOR, ARRAY SUBSTRATE, THEIR MANUFACTURING METHODS, AND DISPLAY DEVICE

CROSS-REFERENCE TO RELATED APPLICATIONS

This application is the U.S. national phase of PCT Application No. PCT/CN2015/091545 filed on Oct. 9, 2015, which claims priority to Chinese Patent Application No. 201510236824.3 filed on May 11, 2015, the disclosures of which are incorporated in their entirety by reference herein.

TECHNICAL FIELD

The present disclosure relates to the field of display technology, in particular to a thin film transistor (TFT), an array substrate, their manufacturing methods, and a display device.

BACKGROUND

As the most important electronic element in the field of display technology, TFT is used to control and drive a subpixel of a liquid crystal display (LCD) and an organic light-emitting diode (OLED) display.

Along with the rapid development of the display technology, amorphous silicon (a-Si) TFTs have been gradually replaced with lower temperature poly-silicon (LTPS) TFTs, metal-induced lateral crystallization (MILC) TFTs and oxide TFTs.

For the commonly-used oxide TFT, an oxide semiconductor is used as an active layer, so it has such advantages as large mobility rate, high on-state current, excellent switching characteristic and excellent uniformity. The oxide TFT may be applied to a display device where rapid response and large current are required, e.g., a high-frequency, high-resolution and large-scale display device or an organic light-emitting display device.

However, in the related art, most of the oxide semiconductors contain some rare metal elements, e.g., indium and strontium. An abundance of indium in the earth's crust is merely about 0.049 ppm. Due to the excessive consumption of indium, elemental indium becomes less and less, so its price becomes higher and higher. As a result, the production cost of the display device will increase, and the mass production thereof will be limited.

SUMMARY

An object of the present disclosure is to provide a TFT, an array substrate, their manufacturing methods, and a display device, so as to reduce a usage amount of indium in a semiconductor active layer, thereby to reduce the production cost.

In one aspect, the present disclosure provides in some embodiments a method for manufacturing a TFT, including a step of forming a pattern of a semiconductor active layer on a transparent substrate through a patterning process, the pattern of the semiconductor active layer including a lanthanum boride pattern.

In another aspect, the present disclosure provides in some embodiments a method for manufacturing an array substrate, including the above-mentioned method for manufacturing a TFT.

In yet another aspect, the present disclosure provides in some embodiments a TFT including a pattern of a semiconductor active layer. The pattern of the semiconductor active layer includes a lanthanum boride pattern.

In still yet another aspect, the present disclosure provides in some embodiments an array substrate including the above-mentioned TFT.

In still yet another aspect, the present disclosure provides in some embodiments a display device including the above-mentioned array substrate.

According to the TFT, the array substrate, their manufacturing methods, and the display device in the embodiments of the present disclosure, the method for manufacturing the TFT includes a step of forming the pattern of the semiconductor active layer on the transparent substrate through a patterning process, and the pattern of the semiconductor active layer includes the lanthanum boride pattern. In this way, the semiconductor active layer may include lanthanum boride as a main component. Although lanthanum is a rare earth element, its abundance in the earth's crust is 30 ppm, far greater than the abundance of indium. In addition, annual consumption of lanthanum is also far less than that of indium. Hence, the semiconductor active layer made of lanthanum boride is obviously advantageous over the semiconductor active layer containing indium in terms of the production cost and the sustainable usage. In addition, for lanthanum boride, lanthanum is located at a body center of a cube. Six boron elements form a regular octahedron, and a body center of each regular octahedron is located at a vertex of the cube. Electron orbits of the lanthanum elements in adjacent lattices may overlap each other to form an electronic channel. Hence, lanthanum boride has very high mobility and conductivity, and the semiconductor active layer made of lanthanum boride has high electron mobility. As a result, it is able to increase an on/off current ratio of the resultant TFT, thereby to prevent the occurrence of current leakage conveniently. In addition, it is able to increase a charging rate of the display device, thereby to improve a display effect.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

FIG. 3 is a flow chart of a method for manufacturing the TFT in FIG. 2a;

FIG. 4 is a transfer characteristic curve of the TFT in FIG. 2a;

FIG. 6 is another transfer characteristic curve of the TFT in FIG. 2a.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
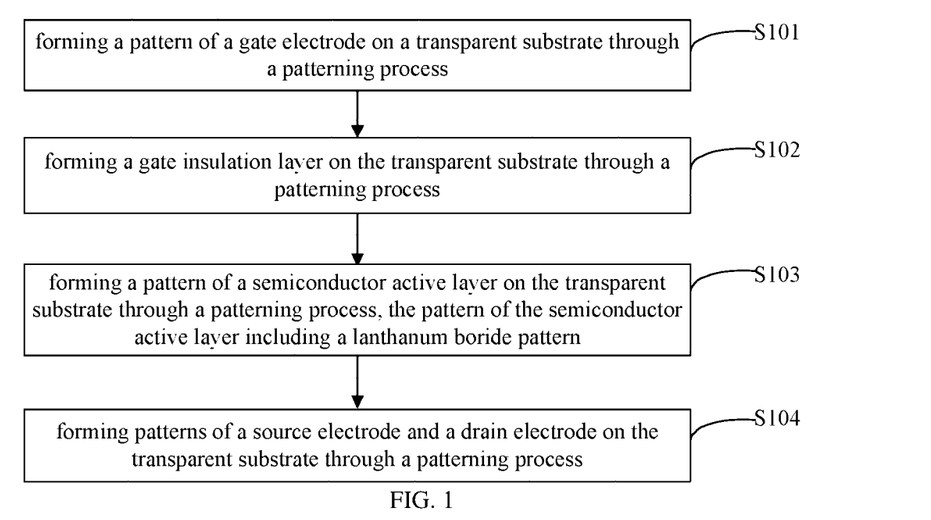
FIG. 1 is a flow chart of a method for manufacturing a TFT according to one embodiment of the present disclosure.
Figure 2A:
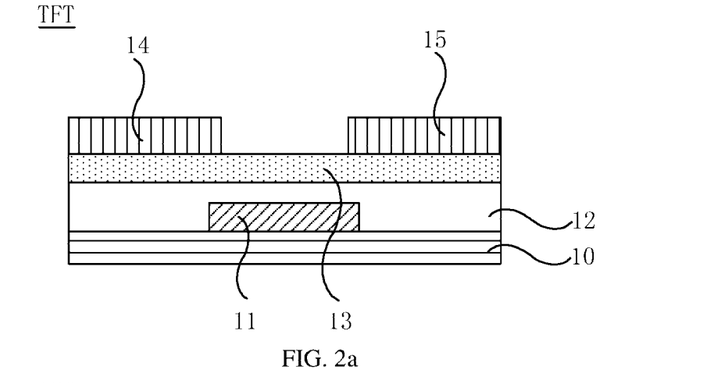
FIG. 2a is a schematic view showing a bottom-gate TFT according to one embodiment of the present disclosure.

The present disclosure provides in some embodiments a method for manufacturing a TFT which, as shown in FIG. 1, may include: Step S101 of, as shown in FIG. 2a, forming a pattern of a gate electrode 11 on a transparent substrate 10 through a patterning process; Step S102 of forming a gate insulation layer 12 on the transparent substrate 10 through a patterning process; Step S103 of forming a pattern of a semiconductor active layer 13 on the transparent substrate 10, the pattern of the semiconductor active layer 13 including a lanthanum boride pattern; and Step S104 of forming patterns of a source electrode 14 and a drain electrode 15 on the transparent substrate 10 through a patterning process.

It should be appreciated that, firstly, the order of Steps S101 to S104 is not particularly defined herein. For example, in the case that the TFT is a bottom-gate TFT as shown in FIG. 2a, Step S101 may be performed at first, so as to form the pattern of the gate electrode 11 on the transparent substrate 10; next, the gate insulation layer 12 may be formed on the transparent substrate with the pattern of the gate electrode 11; then, the pattern of the semiconductor active layer 13 including the lanthanum pattern may be formed on the transparent substrate with the gate insulation layer 12; and finally, the patterns of the source electrode 14 and the drain electrode 15 may be formed on the transparent substrate with the pattern of the semiconductor active layer 13.

Figure 2B:
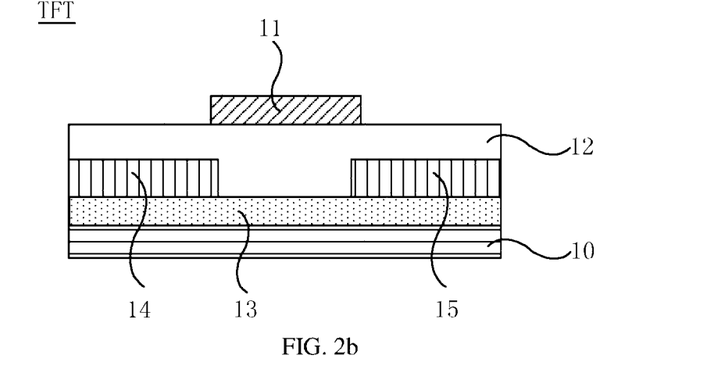
FIG. 2b is a schematic view showing a top-gate TFT according to one embodiment of the present disclosure.

In the case that the TFT is a top-gate TFT as shown in FIG. 2b, Step S103 may be performed at first, so as to form the pattern of the semiconductor active layer 13 including the lanthanum boride pattern on the transparent substrate 10; next, the patterns of the source electrode 14 and the drain electrode 15 may be formed on the transparent substrate with the pattern of the semiconductor active layer 13; and then, the gate insulation layer 12 and the pattern of the gate electrode 11 may be formed sequentially on the transparent substrate with the patterns of the source electrode 14 and the drain electrode 15.

In a word, the bottom-gate TFT and the top-gate TFT depend on positions of the gate electrode 11 and the gate insulation layer 12. To be specific, as shown in FIG. 2a, in the case that the gate electrode 11 is arranged close the transparent substrate 10 and the gate insulation layer 12 is arranged away from the transparent substrate 10, the TFT is a bottom-gate TFT. In the case that the gate electrode 11 is arranged away from the transparent substrate 10 and the gate insulation layer 12 is arranged close to the transparent substrate 10, the TFT is a top-gate TFT.

The following description is given by taking the bottom-gate TFT as an example. Of course, it may also be applied to the top-gate TFT, which also falls within the scope of the present disclosure. Due to an identical principle, the top-gate TFT will not be particularly defined hereinafter.

In addition, the implementations of Steps S101, S102 and S104 may refer to those in the related art.

Secondly, the patterning processes mentioned in the embodiments of the present disclosure may include an photoetching process, or including the photoetching process and an etching process. In addition, the patterning process may further include any other processes for forming a predetermined pattern, e.g., a printing process or an ink-jetting process. The photoetching process includes such processes as film-forming, exposing and developing, and specifically, it may include any processes for forming a pattern using a photoresist, a mask plate and an exposure machine. The corresponding patterning process may be selected in accordance with the structure to be formed.

Thirdly, the transparent substrate 10 may be made of a hard material, e.g., a glass substrate, a hard resin substrate, or a transparent substrate made of a flexible material. In addition, in the above-mentioned steps, the layers may be directly formed on a surface of the transparent substrate 10, or formed on the transparent substrate 10 on which some other layers or patterns have already been formed.

Fourthly, in the embodiments of the present disclosure, the semiconductor active layer 13 is mainly made of $La_xB_y$. In the case that y is 1, x may be a value within a range of 0.05 to 1. The values of y and x may be adjusted in accordance with the practical need. The larger the content of boron, the lower the concentration of carriers and the conductivity. At this time, it is able to convert lanthanum boride from a conductor into a semiconductor.

To be specific, in the case that the semiconductor active layer 13 consists of a single layer, the single layer may be a lanthanum boride layer. In the case that the semiconductor active layer 13 consists of a plurality of layers, the lanthanum boride layer may be an intermediate layer of the plurality of layers, and the lanthanum boride layer may be of a thickness larger than the other layers. For the multi-layered semiconductor active layer 13, the other layers may be made of a metal oxide semiconductor, e.g., indium gallium zinc oxide (IGZO). Because the content of indium in the entire semiconductor active layer 13 is smaller than lanthanum boride, so it is able to reduce the usage content of indium, thereby to reduce the production cost.

In addition, lanthanum boride also has such advantages as high melting point, resistance to ion bombardment, anti-oxidation, heat conduction and excellent chemical stability. Further, it has mobility higher than a-Si.

According the embodiments of the present disclosure, the method for manufacturing the TFT includes the step of forming the pattern of the semiconductor active layer on the transparent substrate through a patterning process, and the pattern of the semiconductor active layer includes the lanthanum boride pattern. In this way, the semiconductor active layer may include lanthanum boride as a main component. Although lanthanum is a rare earth element, its abundance in the earth's crust is 30 ppm, far greater than the abundance of indium. In addition, annual consumption of lanthanum is also far less than that of indium. Hence, the semiconductor active layer made of lanthanum boride is obviously advantageous over the semiconductor active layer containing indium in terms of the production cost and the sustainable usage. In addition, for lanthanum boride, lanthanum is located at a body center of a cube. Six boron elements form a regular octahedron, and a body center of each regular octahedron is located at a vertex of the cube. Electron orbits of the lanthanum elements in adjacent lattices may overlap each other to form an electronic channel. Hence, lanthanum boride has very high mobility and conductivity, and the semiconductor active layer made of lanthanum boride has high electron mobility. As a result, it is able to increase an on/off current ratio of the resultant TFT, thereby to prevent the occurrence of current leakage conveniently. In addition, it is able to increase a charging rate of the display device, thereby to improve a display effect.

The method for manufacturing the TFT will be described hereinafter in more details.

First Embodiment

Figure 3:
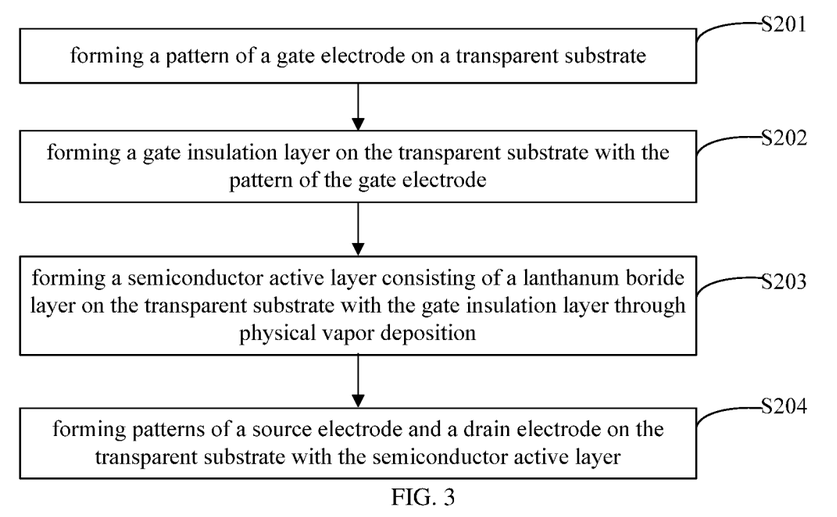

The method in this embodiment is used to manufacture the TFT in FIG. 2a, where the semiconductor active layer 13 mainly containing lanthanum boride is formed through physical vapor deposition. As shown in FIG. 3, the method may include the following steps.

Step S201: forming the pattern of the gate electrode 11 on the transparent substrate 10. To be specific, a gate metal layer having a thickness of 100 nm to 2000 nm on the transparent substrate 10 through physical vapor deposition. The gate metal layer may be made of a metal, a metal alloy or a conductive metal oxide. It may consist of two or more layers made of a conductive material, e.g., two molybdenum (Mo) layers and an aluminum (Al) layer arranged between the two Mo layers, i.e., Mo/Al/Mo. Then, a photoresist may be applied onto a surface of the gate metal layer, and the gate metal layer may be exposed, developed and etched using a common mask plate, so as to expose a part of the surface of the gate metal layer. Then, a portion of the gate metal layer not covered by the photoresist may be etched, so as to form the pattern of the gate electrode 11.

Step S202: forming the gate insulation layer 12 on the transparent substrate with the pattern of the gate electrode 11. To be specific, the gate insulation layer 12 may be formed on the transparent substrate with the pattern of the gate electrode 11 through physical vapor deposition, chemical vapor deposition, electrochemical oxidation or thermal oxidation, and the gate insulation layer 12 may have a thickness of 50 nm to 1000 nm. The gate insulation layer may be made of at least one of $SiO_2$, $SiN_x$, $SiON$, $Al_2O_3$, $Ta_2O_5$, $Y_2O_3$ or $HfO_2$.

Step S203: forming the semiconductor lanthanum boride layer on the transparent substrate with the gate insulation layer 12 through physical vapor deposition. To be specific, the lanthanum boride layer may be formed at an atmospheric pressure of 0.02 Pa to 0.5 Pa. In the case that the atmospheric pressure is less than 0.02 Pa or greater than 0.5 Pa, the performance of lanthanum boride may be degraded. In order to improve the stability of the lanthanum boride layer, optionally, the atmospheric pressure may be 0.05 Pa to 0.3 Pa.

In addition, in the case that the atmospheric pressure is 0.05 Pa to 0.3 Pa, the lanthanum boride layer may grow at a rate of 10 nm/min to 100 nm/min. In the case that the growth rate of the lanthanum boride layer is less than 10 nm/min, the production efficiency may decrease, and in the case that the growth rate is greater than 100 nm/min, the performance of the lanthanum boride layer may be degraded. It should be appreciated that, for the lanthanum boride layer, the concentration of carriers and the conductivity of the lanthanum boride layer may decreases along with an increase in the content of boron, so as to convert lanthanum boride from a conductor to a semiconductor conveniently. Further, in lanthanum boride, boron is lighter than lanthanum and it is greatly affected by the growth rate. Hence, within the range of the growth rate, i.e., 10 nm/min to 100 nm/min, the greater the growth rate, the more easily boron may reach the transparent substrate, and the higher the content of boron in the lanthanum boride layer. In order to improve the stability of the lanthanum boride layer, optionally, the growth rate may be 20 nm/min to 100 nm/min.

It should be appreciated that, during the formation of the lanthanum boride layer through physical vapor deposition, the atmospheric pressure may be an atmospheric pressure in a physical vapor deposition chamber, and during the formation thereof through sputtering, the atmospheric pressure may be a sputtering pressure for a target.

In addition, the resultant lanthanum boride layer may have a thickness of 10 nm to 500 nm. The performance of the TFT may be affected by the layers of the TFT, especially the semiconductor active layer. In the case that the thickness of the lanthanum boride layer is less than 10 nm or greater than 500 nm, the stability, and thereby the yield, of the TFT may decrease. In order to improve the stability of the TFT, the thickness of the lanthanum boride layer may be 20 nm to 200 nm.

It should be appreciated that, in the case that the semiconductor active layer consist of a plurality of layers and the lanthanum boride layer is an intermediate layer arranged between the other layers, the lanthanum boride layer may have a thickness greater than the other layers, e.g., it may have a thickness of 10 nm to 500 nm. The other layers may each be of a thickness of 10 nm to 50 nm, and made of a metal oxide semiconductor, e.g., IGZO. Because the content of indium in the entire semiconductor active layer 13 is smaller than lanthanum boride, so it is able to reduce the usage content of indium, thereby to reduce the production cost.

In addition, during the manufacture, the concentration of the carriers in the lanthanum boride layer may be controlled within a range of $10^{15}$ cm$^{-3}$ to $10^{18}$ cm$^{-3}$, so as to convert the lanthanum boride layer into a semiconductor. In the case that the concentration of the carriers is less than $10^{15}$ cm$^{-3}$, the electron mobility of the lanthanum boride layer may be too low, and in the case that the concentration of the carriers is greater than $10^{18}$ cm$^{-3}$, the current leakage of the TFT may increase, and thereby the switching characteristic of the TFT may be adversely affected. In the case that the concentration of the carriers increases continuously, the semiconductor active layer may become a conductor, and the TFT may become invalid. It should be appreciated that, lanthanum is less affected by pressure than boron, so the pressure of an inertia gas such as argon or nitrogen may be reduced appropriately in the case that the lanthanum boride layer is formed by physical vapor deposition. In this way, it is able to facilitate the position of boron onto the substrate and increase the content of boron in the lanthanum boride layer, thereby to reduce the concentration of the carriers and the conductivity, and facilitate the conversion of the lanthanum boride layer from a conductor into a semiconductor.

After the lanthanum boride layer having a semiconductor characteristic, a photoresist may be applied onto a surface of the lanthanum boride layer. Then, the photoresist may be subjected to a masking process, an exposing process and a developing process using a common mask plate, so as to expose a part of the surface of the lanthanum boride layer. Next, the lanthanum boride layer not covered by the photoresist may be etched, so as to form the pattern of the semiconductor active layer 13.

Step S204: forming patterns of the source electrode 14 and the drain electrode 15 on the transparent substrate with the semiconductor active layer 13. To be specific, a data metal layer having a thickness of 100 nm to 1000 nm may be formed on the transparent substrate with the semiconductor active layer 13 through physical vapor deposition. The data metal layer may be made of a metal, a metal alloy or a conductive metal oxide. It may consist of more than two layers, e.g., two Mo layers and an Al metal layer arranged between the two Mo layers, i.e., Mo/Al/Mo. Next, a photoresist may be applied to a surface of the data metal layer, and then subjected to a masking process, an exposing process and a developing process, so as to expose a part of the surface of the data metal layer. Then, the data metal layer not covered by the photoresist may be etched, so as to form the patterns of the source electrode 14 and the drain electrode 15.

In this embodiment, the semiconductor active layer 13 mainly containing lanthanum boride is manufactured through physical vapor deposition. The method for manufacturing the TFT will be described in the following embodiments by taking the semiconductor active layer 13 formed through sputtering as an example.

Second Embodiment

The method in this embodiment may be used to manufacture the TFT as shown in FIG. 2a, and it may include the following steps.

At first, an Al layer having a thickness of 300 nm may be formed on the transparent substrate 10, and then subjected to masking, exposing, etching and developing processes to form the pattern of the gate electrode 11.

Next, the gate insulation layer 12 having a thickness of 200 nm may be formed on the transparent substrate with the pattern of the gate electrode 11 through anodic oxidation.

Next, the lanthanum boride layer may be formed on the transparent substrate with the gate insulation layer 12 through sputtering. To be specific, a lanthanum boride target may be placed on a sputtering device, so as to form the lanthanum boride layer having a thickness of 20 nm through sputtering at an atmospheric pressure of 0.3 Pa and a growth rate of 10 nm/min. Then, the lanthanum boride layer may be subjected to masking, exposing, developing and etching processes, so as to form the pattern of the semiconductor active layer 13. The semiconductor active layer 13 has a concentration of carriers of about $10^{18}$ cm$^{-3}$, and a mobility rate of about 3 cm$^2$/Vs.

Finally, an ITO layer having a thickness of 380 nm may be formed on the transparent substrate with the semiconductor active layer 13 through sputtering, and then subjected to masking, exposing, developing and etching processes so as to form the patterns of the source electrode 14 and the drain electrode 15.

Figure 4:
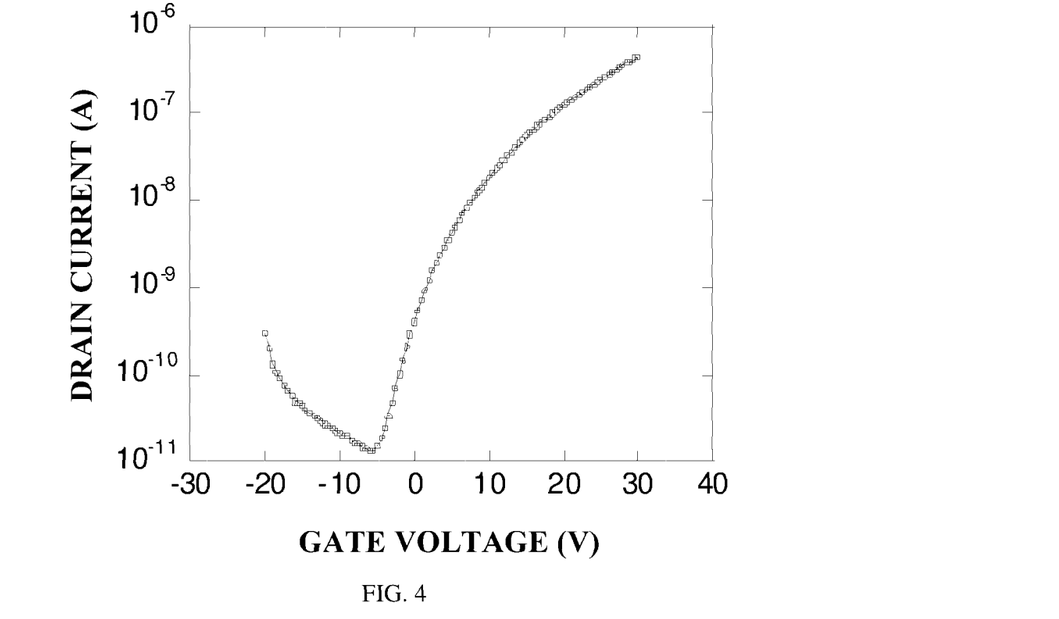

FIG. 4 shows a transfer characteristic curve of the resultant TFT. In FIG. 4, in the case that a gate voltage applied to the TFT is 0V, a drain current is about $10^{-9.5}$ A.

Third Embodiment

Figure 2C:
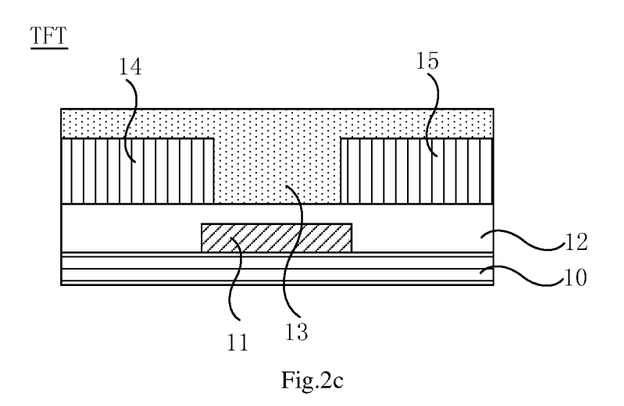
FIG. 2c is another schematic view showing the bottom-gate TFT according to one embodiment of the present disclosure.

The method in this embodiment may be used to manufacture the TFT as shown in FIG. 2c. Different from the bottom-gate TFT in the second embodiment, for the TFT in this embodiment, the semiconductor active layer 13 is arranged above the source electrode 14 and the drain electrode 15, so the step of forming the semiconductor active layer 13 is performed subsequent to the step of forming the source electrode 14 and the drain electrode 15.

In this embodiment, except the step of forming the semiconductor active layer 13, the steps of forming the other layers in the method may be identical to those mentioned in the second embodiment.

The step of forming the semiconductor active layer 13 includes forming the lanthanum boride layer on the transparent substrate with the source electrode 14 and the drain electrode 15 through sputtering, and then forming the pattern of the semiconductor active layer 13 through masking, exposing, etching and developing processes. To be specific, a lanthanum boride target may be placed on a sputtering device, so as to form the lanthanum boride layer having a thickness of 40 nm through sputtering at an atmospheric pressure of 0.1 Pa and a growth rate of 20 nm/min. The resultant semiconductor active layer 13 may have a concentration of carriers of about $10^{17}$ cm$^{-3}$ and a mobility rate of about 1.5 cm$^2$/Vs.

Figure 5:
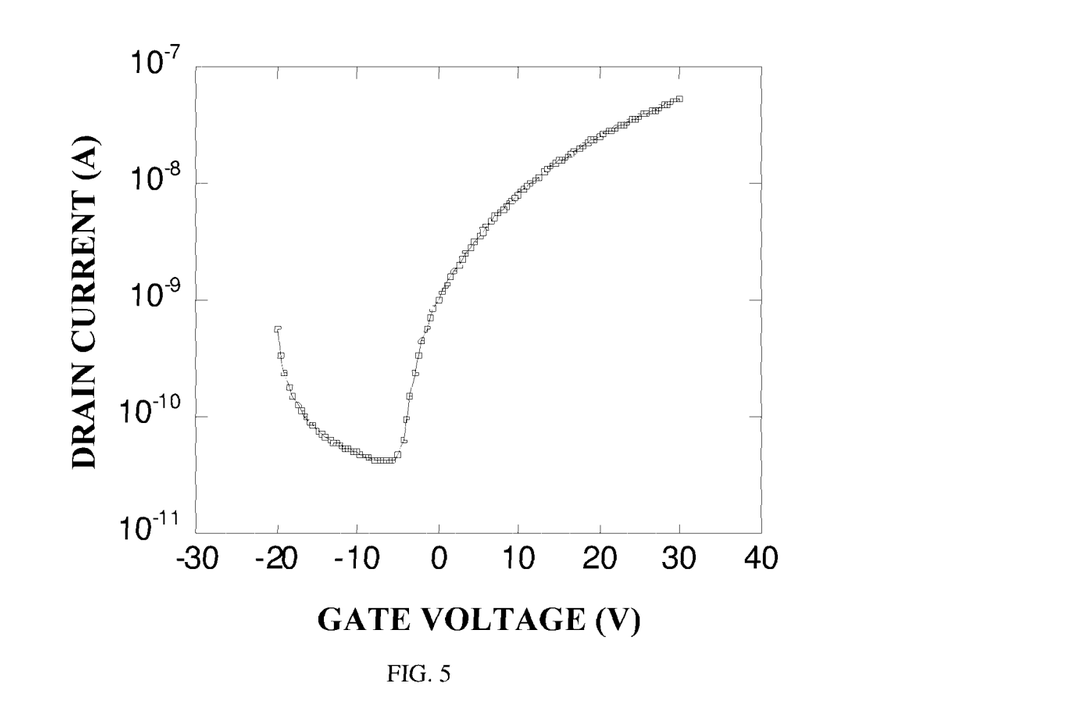
FIG. 5 is a transfer characteristic curve of the TFT in FIG. 2c.

FIG. 5 shows a transfer characteristic curve of the resultant TFT. In FIG. 5, in the case that a gate voltage applied to the TFT is 0V, a drain current is about $10^{-9}$ A.

Fourth Embodiment

The method in this embodiment may be used to manufacture the TFT as shown in FIG. 2a. Except the step of forming the semiconductor active layer 13, the steps of forming the other layers in the method may be identical to those mentioned in the second embodiment.

The step of forming the semiconductor active layer 13 includes forming the lanthanum boride layer on the transparent substrate with the gate insulation layer 12 through sputtering, and then forming the pattern of the semiconductor active layer 13 through masking, exposing, etching and developing processes. To be specific, a lanthanum boride target may be placed on a sputtering device, so as to form the lanthanum boride layer having a thickness of 100 nm through sputtering at an atmospheric pressure of 0.05 Pa and a growth rate of 30 nm/min. The resultant semiconductor active layer 13 may have a concentration of carriers of about $10^{15}$ cm$^{-3}$ and a mobility rate of about 2.8 cm$^2$/Vs.

Figure 6:
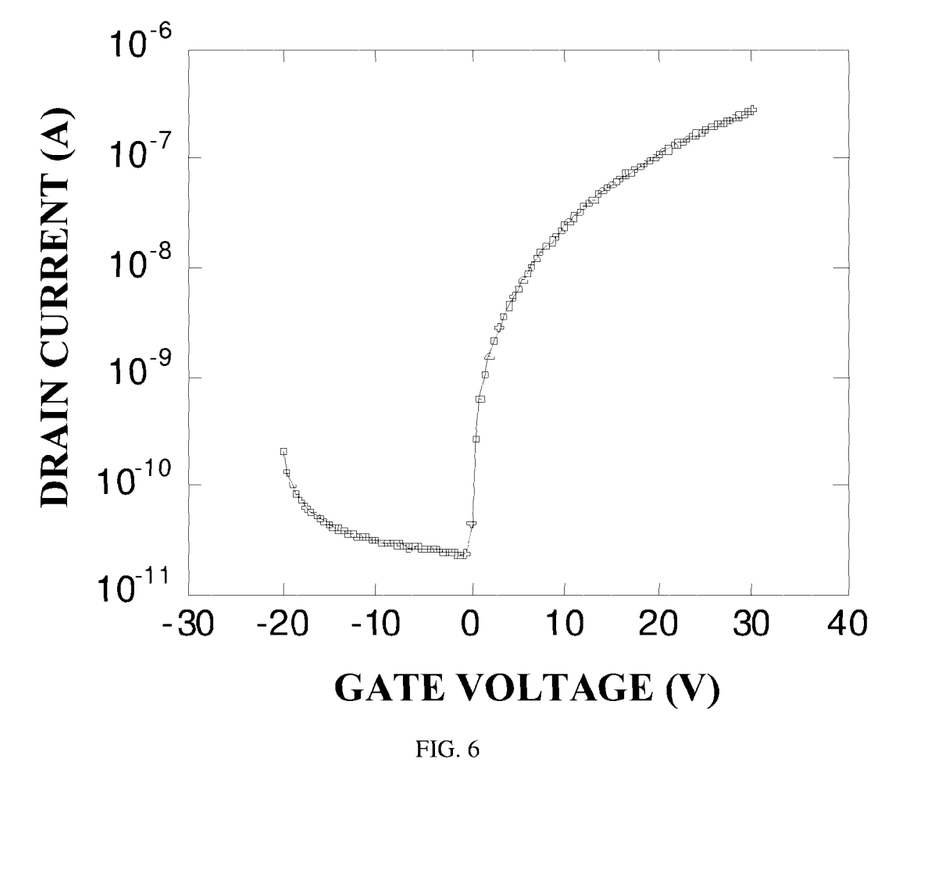

FIG. 6 shows a transfer characteristic curve of the resultant TFT. In FIG. 6, in the case that a gate voltage applied to the TFT is 0V, a drain current is about $10^{-10.5}$ A.

As shown in FIGS. 4, 5 and 6, in the case that the gate voltage of the TFT is 0V, the TFT in the fourth embodiment has a minimal drain current, i.e., the minimal off-state current. In the case that the gate voltage of the TFT is within a range from 0V to 10V, the curve in FIG. 6 has a maximal slope, so the drain current of the TFT in the fourth embodiment may increase most rapidly. Hence, the TFT in the fourth embodiment have the most rapid switch response speed and the best switching characteristic.

The present disclosure further provides in some embodiments a method for manufacturing an array substrate, including the above-mentioned method for manufacturing the TFT. The steps of the method for manufacturing the TFT and the beneficial effects thereof have been described hereinbefore, and thus will not be particularly defined herein.

For example, in the case that the array substrate includes the bottom-gate TFT as shown in FIG. 2, the method for manufacturing the array substrate may include the following steps.

At first, a gate metal layer having a thickness of 100 nm to 2000 nm may be formed on the transparent substrate 10 through physical vapor deposition. Next, a photoresist may be applied onto a surface of the gate metal layer, and then subjected to exposing, developing and etching processes with a common mask plate, so as to expose a part of the surface of the gate metal layer. Then, the gate metal layer not covered by the photoresist may be etched, so as to form patterns of the gate electrode 11 and a gate line.

Then, the gate insulation layer 12 having a thickness of 50 nm to 1000 nm may be formed on the transparent substrate with the patterns of the gate electrode and the gate line through physical vapor deposition, chemical vapor deposition, electrochemical oxidation or thermal oxidation.

Next, the semiconductor lanthanum boride layer may be formed on the transparent substrate with the gate insulation layer 12 through physical vapor deposition. The formation of the lanthanum boride layer may refer to that mentioned in the first embodiment. After the formation of the lanthanum boride layer having a semiconductor characteristic, a photoresist may be applied onto a surface of the lanthanum boride layer, and then subjected to exposing, developing and etching processes with a common mask plate, so as to expose a part of the surface of the lanthanum boride layer. Then, the lanthanum boride layer not covered by the photoresist may be etched, so as to form the pattern of the semiconductor active layer 13.

Next, the data metal layer having a thickness of 100 nm to 1000 nm may be formed on the transparent substrate with the semiconductor active layer 13. A photoresist may be applied onto a surface of the data metal layer, and then subjected to exposing, developing and etching processes with a common mask plate, so as to expose a part of the surface of the data metal layer. Then, the data metal layer not covered by the photoresist may be etched, so as to form patterns of the source electrode 14, the drain electrode 15 and a data line.

Next, the passivation layer may be formed on the transparent substrate with the patterns of the source electrode 14, the drain electrode 15 and the data line.

Next, the via-hole may be formed in the passivation layer through a patterning process, so as to expose a portion of the drain electrode 15.

Finally, a pixel electrode may be formed on the passivation layer with the via-hole through a patterning process, so that the pixel electrode is connected to the drain electrode 15 through the via-hole.

The above description is merely given by taking the array substrate including the TFT as shown in FIG. 2a as an example. Of course, the array substrate including the TFT as shown in FIG. 2b or 2c, or including both the pixel electrode and a common electrode, will also fall within the scope of the present disclosure.

The present disclosure further provides in some embodiments a TFT which, as shown in FIG. 2a, 2b or 2c, may include the gate electrode 11, the gate insulation layer 12, the semiconductor active layer 13, the source electrode 14 and the drain electrode 15. The semiconductor active layer 13 may mainly consist of lanthanum boride.

Optionally, the lanthanum boride layer may have a thickness of 10 nm to 500 nm. The performance of the TFT may be affected by the layers of the TFT, especially the semiconductor active layer. In the case that the thickness of the lanthanum boride layer is less than 10 nm or greater than 500 nm, the stability, and thereby the yield, of the TFT may decrease.

In this way, the semiconductor active layer may include lanthanum boride as a main component. Although lanthanum is a rare earth element, its abundance in the earth's crust is 30 ppm, far greater than the abundance of indium. In addition, annual consumption of lanthanum is also far less than that of indium. Hence, the semiconductor active layer made of lanthanum boride is obviously advantageous over the semiconductor active layer containing indium in terms of the production cost and the sustainable usage. In addition, for lanthanum boride, lanthanum is located at a body center of a cube. Six boron elements form a regular octahedron, and a body center of each regular octahedron is located at a vertex of the cube. Electron orbits of the lanthanum elements in adjacent lattices may overlap each other to form an electronic channel. Hence, lanthanum boride has very high mobility and conductivity, and the semiconductor active layer made of lanthanum boride has high electron mobility. As a result, it is able to increase an on/off current ratio of the resultant TFT, thereby to control the current leakage conveniently. In addition, it is able to increase a charging rate of the display device, thereby to improve a display effect.

The present disclosure further provides in some embodiments an array substrate including the above-mentioned TFT. The structure of the TFT and the beneficial effects thereof have been described hereinbefore, and thus will not be particularly defined herein.

The present disclosure further provides in some embodiments a display device including the above-mentioned array substrate. The display device may be a liquid crystal display device. For example, it may be any product or member having a display function, such as liquid crystal display, liquid crystal television, digital photo frame, mobile phone or flat-panel computer. The structure of the array substrate and the beneficial effects thereof have been described hereinbefore, and thus will not be particularly defined herein.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A method for manufacturing a thin film transistor (TFT), comprising a step of forming a pattern of a semiconductor active layer on a transparent substrate through a patterning process, wherein the pattern of the semiconductor active layer comprises a lanthanum boride pattern,
   wherein the step of forming the pattern of the semiconductor active layer through a patterning process comprises:
   forming a lanthanum boride layer on the transparent substrate through physical vapor deposition or sputtering at a pressure of 0.02 Pa to 0.5 Pa;
   applying a photoresist onto a surface of the lanthanum boride layer;
   subjecting the photoresist to masking, exposing and developing processes, to expose a part of a surface of the lanthanum boride layer; and
   etching the lanthanum boride layer not covered by the photoresist, to form the pattern of the semiconductor active layer.

2. The method according to claim 1, wherein the pressure is 0.05 Pa to 0.3 Pa, and the lanthanum boride layer is grown at a growth rate of 10 nm/min to 100 nm/min.

3. The method according to claim 2, wherein the lanthanum boride layer is grown at a growth rate of 20 nm/min to 100 nm/min.

4. The method according to claim 1, wherein in the case that the lanthanum boride layer is formed through physical vapor deposition, a pressure of an inertia gas is reduced to facilitate the deposition of boron onto the transparent substrate.

5. The method according to claim 1, wherein the lanthanum boride pattern has a thickness of 10 nm to 500 nm.

6. The method according to claim 1, wherein the lanthanum boride pattern has a concentration of carries of 1015 cm−3 to 1018 cm−3.

7. A method for manufacturing an array substrate, comprising the method for manufacturing the TFT according to claim 1.

8. The method according to claim 7, wherein the pressure is 0.05 Pa to 0.3 Pa, and the lanthanum boride layer is grown at a growth rate of 10 nm/min to 100 nm/min.

9. The method according to claim 8, wherein the lanthanum boride layer is grown at a growth rate of 20 nm/min to 100 nm/min.

10. A thin film transistor (TFT), comprising a pattern of a semiconductor active layer, wherein the pattern of the semiconductor active layer comprises a lanthanum boride pattern,
wherein the semiconductor active layer consists of a single layer and the single layer is a lanthanum boride layer; or
wherein the semiconductor active layer consists of a plurality of layers, and the lanthanum boride layer is an intermediate layer of the plurality of layers, and has a thickness greater than the other layers of the plurality of layers.

11. The TFT according to claim 10, wherein the lanthanum boride pattern has a thickness of 10 nm to 500 nm.

12. The TFT according to claim 10, wherein the lanthanum boride pattern has a concentration of carries of 1015 cm−3 to 1018 cm−3.

13. The TFT according to claim 10, wherein the other layers of the plurality of layers are made of a metal oxide semiconductor.

14. An array substrate, comprising the TFT according to claim 10.

15. A display device, comprising the array substrate according to claim 14.

16. A method for manufacturing a thin film transistor (TFT), comprising a step of forming a pattern of a semiconductor active layer on a transparent substrate through a patterning process, wherein the pattern of the semiconductor active layer comprises a lanthanum boride pattern,
wherein the step of forming the pattern of the semiconductor active layer through a patterning process comprises:
forming a lanthanum boride layer having a thickness of 100 nm through sputtering at an operating pressure of 0.05 Pa and a growth rate of 30 nm/min; and
forming the pattern of the semiconductor active layer through masking, exposing, etching and developing processes.

* * * * *